US008284379B2

(12) United States Patent
Phillips

(10) Patent No.: US 8,284,379 B2
(45) Date of Patent: Oct. 9, 2012

(54) DEVICES AND METHODS FOR REDUCING RESIDUAL RETICLE CHUCKING FORCES

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 1121 days.

(21) Appl. No.: 12/062,378

(22) Filed: Apr. 3, 2008

(65) Prior Publication Data

US 2008/0291411 A1 Nov. 27, 2008

Related U.S. Application Data

(60) Provisional application No. 60/922,129, filed on Apr. 6, 2007.

(51) Int. Cl.
*G03B 27/58* (2006.01)
*G03B 27/62* (2006.01)
(52) U.S. Cl. .............................. 355/72; 355/75
(58) Field of Classification Search .............. 355/75, 355/72, 77
See application file for complete search history.

(56) References Cited

U.S. PATENT DOCUMENTS

| 4,391,511 A * | 7/1983 | Akiyama et al. ............ 355/40 |
| 6,135,858 A * | 10/2000 | Takahashi ................... 451/41 |
| 6,480,260 B1 | 11/2002 | Donders et al. |
| 2007/0268476 A1 | 11/2007 | Phillips et al. |
| 2008/0151212 A1 * | 6/2008 | Bleeker et al. ............... 355/72 |

OTHER PUBLICATIONS

U.S. Appl. No. 60/958,481, filed Jul. 5, 2007, Watson, et al.

* cited by examiner

*Primary Examiner* — Peter B Kim
(74) *Attorney, Agent, or Firm* — Klarquist Sparkman, LLP

(57) ABSTRACT

Devices and methods are disclosed for holding an object, particularly a planar object. An exemplary device has a chuck and pressure-changing device. The chuck has an object-mounting surface and a deformable membrane coupled to the object-mounting surface such that conformational changes in the membrane produce corresponding changes in the object-mounting surface. The chuck has a first cavity separated by the membrane from the chuck cavity. The pressure-changing device is coupled to the first cavity to change pressure in the first cavity, relative to outside it, sufficiently to produce a conformational change of the membrane and a corresponding change in the object-mounting surface sufficient to reduce the force with which the object is being held to the object-mounting surface. The pressure change can be a pressure increase or decrease. The change in the object-mounting surface can be, for example, a reduction in area of contact of the object-mounting surface with the object, thereby reducing the holding force.

37 Claims, 7 Drawing Sheets

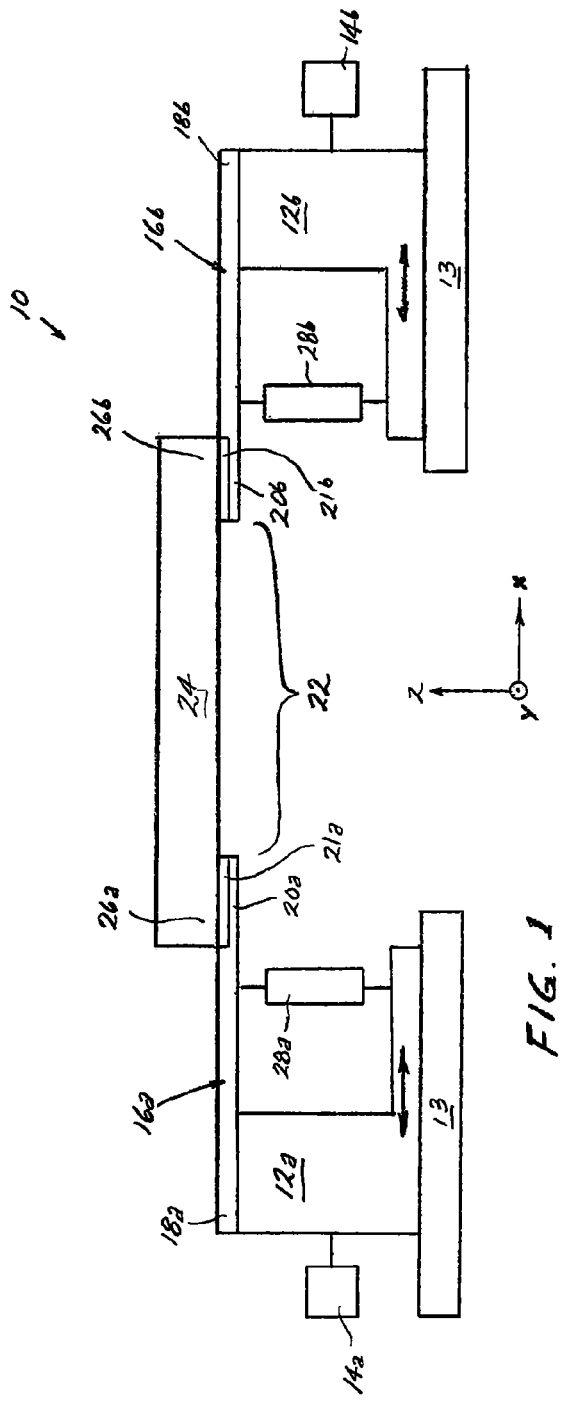
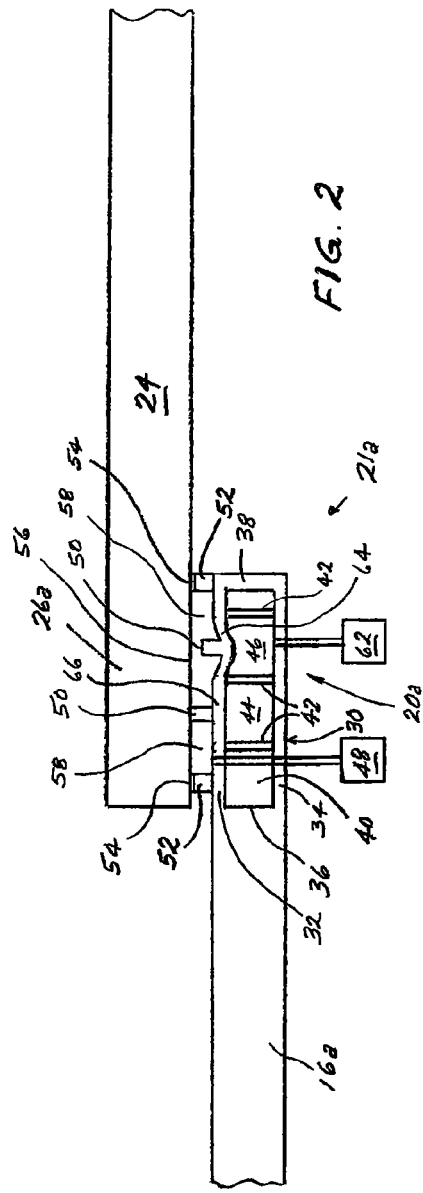

DEVICES AND METHODS FOR REDUCING RESIDUAL RETICLE CHUCKING FORCES

CROSS-REFERENCE TO RELATED APPLICATION

This application claims priority from, and the benefit of, U.S. Provisional Application No. 60/922,129, filed on Apr. 6, 2007, which is incorporated herein by reference in its entirety.

FIELD

This disclosure pertains to, inter alia, microlithography, which is a key imaging technology used in the manufacture of semiconductor micro-devices, displays, and other products having fine structure that can be fabricated by processes that include microlithographic imprinting. More specifically, the disclosure pertains to microlithography involving use of a pattern-defining reticle and to devices for holding a reticle or other planar body.

BACKGROUND

In a typical projection-microlithography system, the pattern to be projected onto the surface of an exposure-sensitive substrate is defined by a pattern master generally termed a "reticle," also called a "mask." In the microlithography system the reticle is mounted on a stage that is capable of undergoing highly accurate movements as required during the lithographic exposure. While mounted on the reticle stage, the reticle is illuminated by a radiation beam (e.g., a beam of deep-ultraviolet or vacuum-ultraviolet light). As the beam propagates downstream from the reticle, the beam carries an aerial image of the illuminated pattern. This downstream beam, called a "patterned beam" or "imaging beam," passes through a projection-optical system that conditions and shapes the patterned beam as required to form an image of the pattern on the surface of an exposure-sensitive lithographic substrate (e.g., a resist-coated semiconductor wafer or plate). For exposure, the substrate also is mounted on a respective movable stage called a "substrate stage" or "wafer stage."

For holding the reticle (usually horizontally) during the making of lithographic exposures, the reticle stage is equipped with a "reticle chuck" mounted to a moving surface of the reticle stage. The reticle chuck holds the reticle suitably for imaging, without damaging the delicate reticle. For example, some reticle chucks hold the reticle by application of vacuum "force." Other reticle chucks hold the reticle by electrostatic or Lorentz-force attraction. In microlithography systems in which the radiation beam is transmitted through the reticle, the reticle usually is held around its periphery (or at least along two opposing sides of the reticle) to avoid blocking light propagating to and from the reticle.

Two important measures of performance of a microlithography system are overlay and image quality. Image quality encompasses any of various parameters such as image resolution, fidelity, sharpness, contrast, and the like. "Overlay" pertains to the accuracy and precision with which a current image is placed relative to a target location for the image. For example, proper overlay requires that the current image be in registration with a previously formed, underlying structure on the substrate.

The manner in which and accuracy with which a reticle is held by a reticle chuck impacts various parameters such as image overlay and image quality on the lithographic substrate. Holding a reticle around its periphery or along two opposing sides leaves middle regions of the reticle unsupported and hence susceptible to gravitational sag. Fortunately, some of these consequences are readily modeled for behavior predictions from which offsetting corrections can be made. For example, a gravitationally sagging central region of the reticle tends to have an ideal deformed shape that is at most second-order (parabolic) about the scanning axis (y-axis) of the reticle. This deformation is consistent and predictable, and can be offset by making appropriate adjustments and/or compensations elsewhere in the system (e.g., in the projection-optical system).

As a reticle is being held on the reticle chuck, it is important to prevent movements of the reticle relative to the chuck and movements of the chuck relative to the reticle stage. Preventing such movements is especially important whenever the reticle stage is accelerating or decelerating while holding a reticle. Desirably, the reticle chuck mounted to the reticle stage produces substantial localized frictional forces at regions of contact of the reticle with the surface of the chuck. One conventional way in which these frictional forces are produced is to hold the reticle to the reticle chuck by vacuum-suction. Whereas this technique can produce effective reticle-holding friction, the reticle may be difficult to remove from the reticle chuck, such as after vacuum-suction has been turned off (e.g., before replacing a reticle currently on the reticle stage with another reticle).

One approach for obtaining reticle-holding friction with chucks employing vacuum-suction is discussed in U.S. Pat. No. 6,480,260 to Donders et al., incorporated herein by reference. Two opposing-side (flanking) regions (relative to the y-direction, the scanning direction) of the reticle are held on the reticle stage using respective "compliant members." The compliant members are strip-like and extend lengthwise along the respective side region of the reticle and along the respective side region of the reticle stage. One lateral side region of the compliant member is mounted to the respective side region of the reticle stage and the other lateral side region of the compliant member extends in a cantilever manner from the respective edge region of the reticle stage. Extending along the cantilevered side region of each compliant member and projecting upward are short walls that define a respective "vacuum space." The corresponding under-side of the reticle rests on the top edges ("lands") of the walls that collectively serve as respective "chuck surfaces," on which the reticle is held by evacuating the vacuum spaces. The compliant members are somewhat resistant to gravitational sag but yield to a limited extent to conform to the shape of the reticle without deforming the reticle.

Another approach is discussed in Applicant's U.S. patent application Ser. No. 11/749,706, incorporated herein by reference, in which the reticle stage has a movable support surface to which a reticle chuck is mounted. More specifically, the reticle chuck is mounted on a distal region of a "membrane," of which a proximal region is mounted to the support surface and a distal region extends from the support surface and at least partially supports the reticle chuck in a cantilever manner. The reticle chuck includes walls and lands defining at least one vacuum cavity and multiple upward-extending pins. The lands and pins contact and support respective regions of the reticle as the vacuum cavity is evacuated to a desired vacuum level. Evacuating the vacuum cavity causes the reticle to adhere to the lands and top surfaces of the pins. Meanwhile, the membrane yields to allow the lands and pins to conform to the shape of the reticle.

From the foregoing, the stability of the reticle on the reticle stage and whether the reticle can be accurately and precisely positioned each time for exposure generally require that the reticle be held securely to the chuck without causing or allowing an uncorrectable distortion of the reticle. But, there are times when it is desirable that the reticle be removable from the chuck without damaging the reticle or chuck. I.e., when using a vacuum chuck, there are situations (e.g., in which the vacuum suction has been turned off but the reticle and chuck are still very smooth and clean) in which the residual force holding the reticle to the chuck is too high to allow ready removal of the reticle from the chuck without significant risk of damaging the reticle chuck and/or the reticle itself.

Therefore, especially when using a vacuum chuck to hold a reticle, there is a need for, inter alia, devices and methods for facilitating separation of the reticle from the reticle chuck without damaging, fracturing, or otherwise degrading the performance of the reticle chuck and/or the reticle.

SUMMARY

The foregoing needs, and others, are addressed by devices and methods as described herein.

According to one aspect, devices are provided for holding an object such as a planar object as a general example and a reticle as a specific example. An embodiment of a holding device comprises a chuck and a pressure-changing device. The chuck comprises an object-mounting surface that contacts and holds a corresponding portion of the object. The chuck also includes a deformable membrane coupled to at least a portion of the object-mounting surface such that a conformational change in the deformable membrane produces a corresponding change in the object-mounting surface. The chuck also includes a first cavity separated by the deformable membrane from the chuck cavity and defined at least in part by the deformable membrane. The pressure-changing device is coupled to the first cavity to change pressure in the first cavity, relative to outside the first cavity, sufficiently to produce a conformational change of the deformable membrane and a corresponding change in the object-mounting surface sufficient to reduce the force with which the portion of the object is being held to the object-mounting surface. The change in the object-mounting surface can be, for example, a reduction in area of contact of the object-mounting surface with the portion of the object, serving to reduce the holding force.

The first cavity can be located relative to the chuck such that a change in pressure in the first cavity causes a corresponding conformational change of the deformable membrane.

The device can include a chuck cavity defined between the deformable membrane and the object-mounting surface. If the chuck is a vacuum chuck, the chuck cavity can be coupled to a first vacuum device that reduces pressure in the chuck cavity relative to outside the chuck cavity. The reduced pressure in the chuck cavity holds the portion of the object to the object-mounting surface by vacuum-suction. The pressure-changing device can include a second vacuum device that reduces pressure in the first cavity to deform the membrane away from the object and thereby reduce the force with which the portion of the object is being held to the object-mounting surface. Desirably, the second vacuum device operates to reduce pressure in the first cavity at a time when the first vacuum device is off.

Pressure-changing devices are not limited to vacuum devices. An exemplary alternative is a pressurizing device that increases pressure in the first cavity, relative to outside the first cavity, to deform the membrane toward the object and thereby reduce the force by which the portion of the object is being held to the object-mounting surface. Both types are operable with a chuck configured as a vacuum chuck.

The holding device can include a chuck cavity defined between the deformable membrane and the object-mounting surface. In such a configuration, multiple pins desirably couple the deformable membrane to the object-mounting surface. The pins extend from the deformable membrane into the chuck cavity and have respective top surfaces collectively defining at least a portion of the object-mounting surface. The pins desirably move with deformation of the membrane to produce the corresponding deformation of the object-mounting surface.

The holding device can include a base, wherein a second membrane connects the chuck to the base. The second membrane can be configured to support the chuck in a cantilever manner relative to the base. In such an embodiment the first cavity can be defined in at least a portion of the second membrane. If the second membrane has an upper membrane portion and a lower membrane portion separated from each other by a space, the first cavity can be defined in the space between the upper and lower membrane portions, and the deformable membrane can be a respective portion of the upper membrane portion.

In some embodiments at least two walls extend from the lower membrane portion toward the upper membrane portion to define the first cavity, in cooperation with the deformable membrane and a corresponding region of the lower membrane portion situated between the walls. If the pressure-changing device includes a vacuum device that reduces pressure in the first cavity relative to outside the first cavity, the lower membrane portion can be movable toward the upper membrane portion in response to the reduced pressure in the first cavity such that the walls contact the upper membrane portion to form a substantially closed first cavity. In the first cavity the reduced pressure urges the deformable membrane away from the object to produce a corresponding deformation of the object-mounting surface. The deformation reduces the force with which the portion of the object is being held to the object-mounting surface.

According to another aspect, reticle stages are provided that include a base and e body movable in at least one direction relative to the base. A vacuum chuck, coupled to the stage body, includes a reticle-mounting surface that receives a corresponding region of a reticle. A cavity is defined by walls and a deformable membrane that is coupled to the reticle-mounting surface. A pressure-changing device is connected to the cavity and is operable to change pressure in the cavity relative to outside the cavity. The pressure change is sufficient to deform the membrane and thus the reticle-mounting surface in a manner that reduces a force with which the reticle is being held to the reticle-mounting surface. Various other features of the vacuum chuck, which can be present singly or in combination, are summarized above.

According to yet another aspect, lithography systems are provided that comprise an optical system and a reticle stage such as any of the embodiments summarized above.

According to yet another aspect, methods are provided for holding a substantially planar object. An embodiment of such a method includes the following. A corresponding region of the object is placed on an object-mounting surface, which is coupled to a membrane. A first force is applied to the region of the object. The first force has magnitude and direction to hold the corresponding region of the object to the object-mounting surface. To prepare for removal of the object from the object-mounting surface, a second force is applied to the membrane. The second force has magnitude and direction to deform the membrane and thus the object-mounting surface coupled thereto in a manner that reduces the first force. This allows the object to be removed from the object-mounting surface with far less concern about damaging the object or the object-mounting surface.

The first force can be produced by a first vacuum-suction, and the second force can be produced by a second vacuum-suction that deforms the membrane, and hence at least a portion of the object-mounting surface, away from the object. In such a situation the method can include the steps of placing the membrane relative to a cavity, and then applying the second vacuum-suction to the cavity to deform the membrane.

In an alternative method, the second force can be produced by application of pneumatic pressure that deforms the membrane, and hence at least a portion of the object-mounting surface, toward the object. In this alternative method, the membrane can be placed to a cavity, wherein the pneumatic pressure is applied to the cavity to deform the membrane.

In any event, the second force desirably is produced at a time when the first force is not being applied.

The foregoing and additional features and advantages of the invention will be more readily apparent from the following detailed description, which proceeds with reference to the accompanying drawings.

BRIEF DESCRIPTION OF THE DRAWINGS

FIG. 1 is an elevational schematic view of a first embodiment of a reticle chuck.

FIG. 2 is an elevational schematic view of the vacuum-chuck region of the embodiment of FIG. 1.

DETAILED DESCRIPTION

Figure 3A:
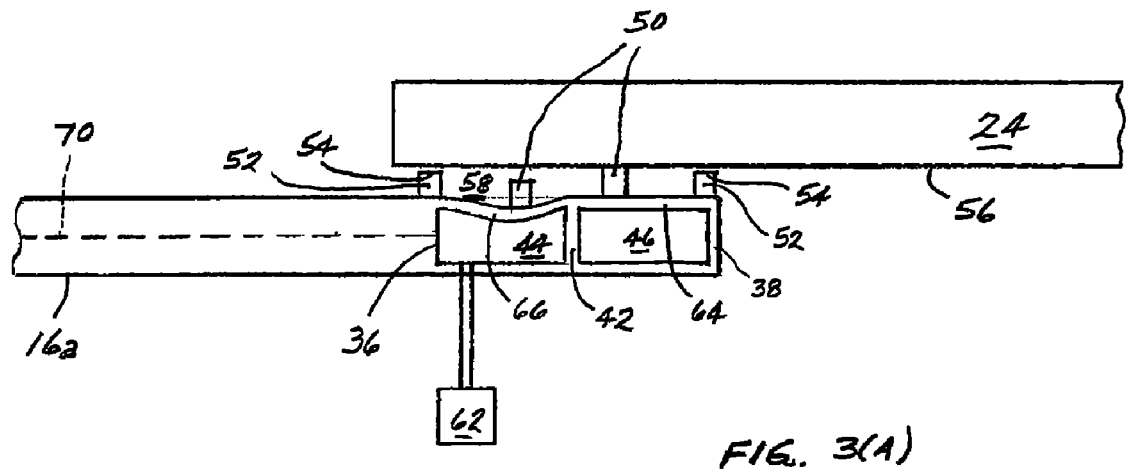
FIG. 3(A) is an elevational schematic view of a first alternative configuration of the embodiment shown in FIG. 2.

The invention is set forth below in the context of representative embodiments that are not intended to be limiting in any way.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

In this disclosure, the term "reticle" is used to denote a pattern-defining object (pattern master) used in microlithography and related techniques. Another term frequently used in microlithography to denote the pattern master is "mask," and it will be understood that "reticle" as used herein encompasses reticles as defined above, masks, and other pattern masters used in microlithography. "Reticle" also is not limited to the context of projection microlithography. During use, a reticle normally is held on a reticle chuck, which in turn is mounted on a reticle stage that performs controlled positioning and movements of the reticle chuck. One technique for holding the reticle on the reticle chuck is vacuum-suction, examples of which are discussed in U.S. Pat. No. 6,480,260 and U.S. patent application Ser. No. 11/749,706, both incorporated herein by reference.

Particular attention is directed to a type of reticle chuck that comprises "membranes" that hold the reticle by vacuum suction. Each membrane is a thin, substantially planar member that is mounted to the reticle stage and extends horizontally (in an x-y plane) in a cantilever manner to provide support for the reticle. Usually, a laterally opposing pair of membranes is employed to hold the reticle as the reticle extends between the membranes. Each membrane has relatively high stiffness in the x-y (shear) directions but retains some flexibility in the z-direction to support the reticle, at least in part, and to allow the membranes to conform to the reticle. The cantilevered regions of the membranes that actually engage the reticle comprise "vacuum chucks." Each vacuum chuck includes pins or analogous support-structures that contact the under-surface of the reticle and define at least one "vacuum space" that is controllably evacuated to apply vacuum-suction to the corresponding regions of the reticle. The vacuum chucks engage respective certain peripheral regions (particularly regions near the left and right edges) of the reticle to allow exposure light to propagate to and from the reticle without obstruction. Reticles that are transmissive to the exposure wavelength are normally held on upward-facing vacuum chucks.

Evacuation of the vacuum spaces of the vacuum chucks as the reticle is resting on them produces a strong suction force holding the reticle to the vacuum chucks. In conventional systems, when the vacuum-suction is turned off, the reticle-holding force may not drop substantially to zero, as desired, but rather have a substantial residual magnitude that can interfere with or prevent removal of the reticle from the vacuum chucks. The residual reticle-holding force can have any of various causes such as, but not limited to, chemical interactions and/or physical interatomic attractions. Chemical interactions involve one or more of covalent bonds, electrostatic bonds, metallic bonds, and hydrogen bonds. Physical interatomic attractions involve, for example, van der Waals forces. Residual reticle-holding force can prevent the reticle from being removed from the reticle chuck without significant risk of damaging the reticle and/or the reticle chuck.

In various embodiments as discussed herein, the vacuum chucks comprise membrane portions that are locally deformable by producing a pressure difference across the membrane portions. This deformation is sufficient to alleviate at least some of the residual reticle-holding force so that the reticle can be more easily removed from the reticle chuck. Depending upon the particular embodiment, production of the pressure difference can be achieved by selective application of vacuum or pressure to one side of the membrane portion relative to the other side of the membrane portion. Application of vacuum for reticle-removal is distinct from application of vacuum suction for reticle-holding. The former is normally performed after or upon turning off the vacuum-suction used for reticle-holding. For reticle-removal, selective application of vacuum or pressure to one side of the deformable membrane portion(s) of the vacuum chucks causes local deformation of the membrane portion(s). The local deformation causes dislocations or shifts, relative to the reticle, of support-structures (e.g., pins) associated with the membrane portion(s). In one example, application of vacuum to one side of the membrane portion(s) causes the membrane portion(s) (and associated support-structures) to move slightly away from the reticle sufficiently to disrupt local contact with the reticle. These motions reduce the magnitude of net residual force holding the reticle to the reticle chuck. In another example, selective application of pressure to one side of the deformable membrane portion(s) causes slight movements of the membrane portion(s) and associated support-structures toward the reticle sufficiently to disrupt contact of flanking membrane portion(s) with the reticle. As a result, the magnitude of net residual force holding the reticle to the reticle chuck is reduced.

In either event, upon achieving local deformations of the membrane portions, the reticle and associated support-structures of the reticle chuck are no longer perfectly matched, compared to when the membrane portions were not locally deformed. The mismatch substantially reduces, or even eliminates, the residual force with which the reticle is being held to the reticle chuck, allowing the reticle to be removed more easily from the reticle chuck.

Reference is made now to FIG. 1, which depicts a reticle stage 10 comprising a stage body 12a, 12b. The stage body 12a, 12b is the movable portion of the stage, and moves relative to a stage base 13 by actuators 14, as generally known in the art. Mounted to the stage body 12a, 12b are respective membranes 16a, 16b. Proximal portions 18a, 18b of the membranes 16a, 16b are mounted to the respective stage body 12a, 12b, and distal portions 20a, 20b of the membranes extend part-way over a horizontal gap 22 between the stage bodies 12a, 12b. The membranes 16a, 16b have distal portions 20a, 20b that include respective "vacuum chucks" 21a, 21b. The reticle 24 is mounted to the vacuum chucks 21a, 21b. Specifically, left and right lateral zones 26a, 26b of the reticle 24 rest upon respective vacuum chucks 21a, 21b. Application of vacuum to the vacuum chucks 21a, 21b holds the reticle 24 to them. Thus, the reticle 24 and membranes 16a, 16b collectively extend over the gap 22.

The membranes 16a, 16b desirably have relatively high stiffness in the x-y directions (shear directions) and relatively low stiffness in the z-direction (bending direction) to facilitate conformance of the vacuum chucks 21, 21b to respective regions of the reticle 24. Additional z-direction support for the membranes 16a, 16b is provided by Z-supports 28a, 28b extending downward to the respective stage body 12a, 12b. The Z-supports 28a, 28b can include flexures. To provide a substantially kinematic mounting of the reticle 24, three Z-supports (e.g., two supports 28a supporting the left-hand membrane 16a, and one support 28b supporting the right-hand membrane 16b) can be used. Each Z-support provides one degree of constraint. Three Z-supports together provide substantially three degrees of constraint (z, $\theta_x$, and $\theta_y$). The two membranes 16a, 16b provide substantially three degrees of constraint (x, y, and $\theta_z$). Together, the membranes 16a, 16b and Z-supports 28a, 28b substantially constrain the reticle 24 in the six rigid-body degrees of freedom.

FIG. 2 shows details of the left-hand distal portion 20a of the membrane 16a and depicts a first representative embodiment of the vacuum chuck 21a. The vacuum chuck 21a can be manufactured separately from the membrane 16a and assembled thereto, or alternatively can be formed integrally with the membrane. The respective materials of the membrane 16a, 21a can be similar or different. Exemplary materials from which to fabricate these components 16a, 21a are fused silica (amorphous quartz), crystalline silica, calcium fluoride, magnesium fluoride, barium fluoride, cordierite (magnesium aluminum silicate), aluminum oxide, invar, ZERODUR® (a brand of glass ceramic from Schott AG, Germany) and any of various metals such as (but not limited to) stainless steel. Particularly desirable materials have extremely low coefficients of thermal expansion, good inertness, and sufficient strength and flexibility for use. The foregoing list is similar to a list of candidate materials for fabricating reticles. Although not shown in FIG. 2, it will be understood that the right-hand vacuum chuck 21b has a structure similar to the left-hand vacuum chuck 21a shown in FIG. 2.

In this embodiment the vacuum chuck 21a includes a respective chamber 30. The chamber 30 is defined in part by an upper membrane portion 32, a lower membrane portion 34, a first side wall 36, and a second side wall 38. The chamber 30 is also defined by end walls (only one (40) of which being denoted in the figure) that are parallel to the plane of the page. The chamber 30 also includes internal walls 42 extending between the upper and lower membrane portions 32, 34. The internal walls 42 define cavities 44, 46 in the chamber 30.

Although the upper membrane portion 32 and lower membrane portion 34 are shown as having substantially the same thickness, this is not intended to be limiting; the lower membrane portion 34 can have, for example, greater thickness than the upper membrane portion 32. Additionally, the upper and lower membrane portions 32, 34 need not be made of the same material or have the same compliance; for example, the lower membrane portion 34 can be made of a more rigid or less compliant material than the upper membrane portion 32.

Extending upward, toward the reticle 24, from the upper membrane portion 32 are pins 50 and walls 52. The pins 50 have respective top surfaces, and the walls 52 have respective "lands" 54. Whenever the reticle 24 is being held by the vacuum chuck 21a, a chuck cavity 58 is defined at least in part by the under-surface 56 of the reticle 24, the upper membrane portion 32, and the walls 52. The chuck cavity 58 is connected to a vacuum device 48 that controllably evacuates the chuck cavity to a desired vacuum level. The vacuum level is suitable for holding the reticle 24 to the vacuum chuck 21a by vacuum-suction.

The walls 52 are slightly shorter than the pins 50 so that the reticle 24 rests on the tops of the pins but not on the lands 54. A small gap (e.g., <5 µm) exists between the lands 54 and the under-surface 56 of the reticle. As the vacuum device 48 evacuates the chuck cavity 58, the surrounding atmosphere bleeds into the chuck cavity 58 via the gap. Meanwhile, the x-y flexibility of the membrane 16a (as well as of the upper membrane portion 32) ensures that substantially all the pins 50 contact the under-surface 56.

In the depicted embodiment, the cavity 46 is connected to a vacuum device 62. Whenever the chuck cavity 58 is being evacuated, such as during use of the reticle 24 for making lithographic exposures, the vacuum device 62 is off. Whenever the chuck cavity 58 is not being evacuated, and/or at other times as desired or required, the vacuum device 62 is on to evacuate the cavity 46 to a vacuum level sufficient to deform at least the corresponding region 64 of the upper membrane portion 32 downward, away from the under-surface 56 of the reticle 24. (This downward deformation is shown highly exaggerated in the figure.) As the membrane region 64 is being deformed in this manner, it carries with it respective pins 50, thereby breaking contact of those pins with the under-surface 56. Consequently, the overall force with which the reticle 24 is being held to the vacuum chuck 21a is reduced. Meanwhile, a similar deformation desirably is being performed on the other vacuum chuck 21b, which allows the reticle 24 to be removed from the reticle chuck.

In an alternative configuration, shown in FIG. 3(A), the cavity 44 (rather than the cavity 46) is connected to the vacuum device 62. Whenever the chuck cavity 58 is not being evacuated, and/or at other times as desired or required, the vacuum device 62 is on to evacuate the cavity 44 to a vacuum level sufficient to deform at least the corresponding region 66 of the upper membrane portion downward, away from the under-surface 56 of the reticle 24. (This downward deformation is shown highly exaggerated in the figure.) As the membrane region 66 is being deformed in this manner, it carries with it respective pins 50, thereby breaking contact of those pins with the under-surface 56. Consequently, the overall force with which the reticle 24 is being held to the vacuum chuck 21a is reduced. Meanwhile, a similar deformation desirably is being performed on the other vacuum chuck 21b, which allows the reticle 24 to be removed from the reticle chuck.

FIG. 3(A) also shows an alternative configuration in which two of the internal walls 42 have been eliminated and only one internal wall 42 has been retained. The cavity 44 is defined between the walls 36 and 42, and the cavity 46 is defined between the walls 42 and 38. Thus, the vacuum chuck shown in FIG. 3(A) has a simpler construction than the vacuum chuck shown in FIG. 2.

Figure 3B:
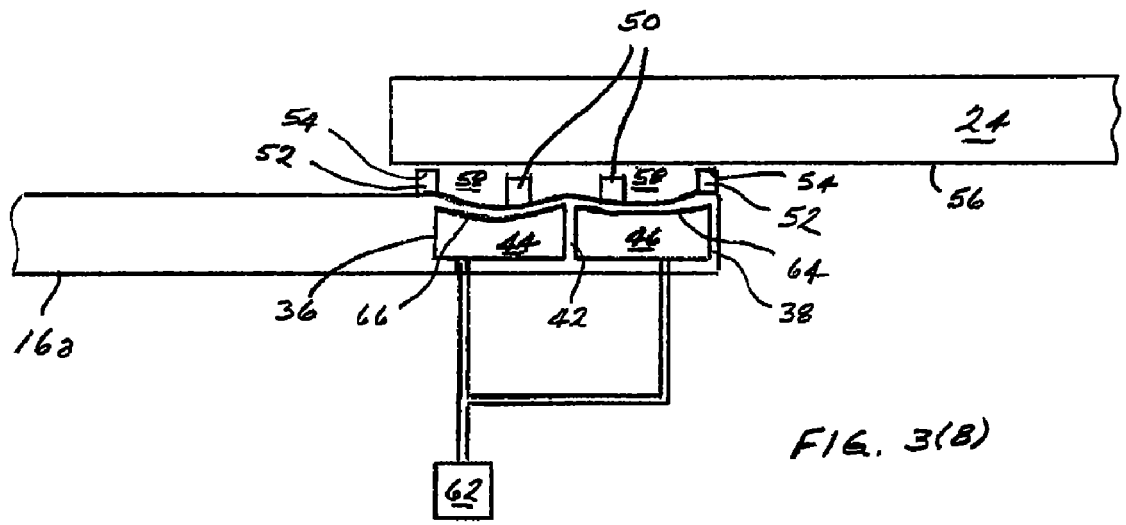
FIG. 3(B) is an elevational schematic view of a second alternative configuration of the embodiment shown in FIG. 2.

In another alternative configuration, shown in FIG. 3(B), both cavities 44, 46 are connected to the vacuum device 62. Whenever the chuck cavity 58 is not being evacuated, and/or at other times as desired or required, the vacuum device 62 is on to evacuate the cavities 44, 46 to vacuum levels sufficient to deform at least the corresponding regions 66, 64 of the upper membrane portion downward, away from the under-surface 56 of the reticle 24. (These downward deformations are shown highly exaggerated in the figure.) As the membrane regions 66, 64 are deformed in this manner, they carry with them respective pins 50, thereby breaking contact of those pins with the under-surface 56. Consequently, the overall force with which the reticle 24 is being held to the vacuum chuck is reduced. Meanwhile, a similar deformation desirably is being performed on the other vacuum chuck 21b, which allows the reticle 24 to be removed from the reticle chuck.

In FIG. 3(B), although the same vacuum system 62 is shown connected directly to both cavities 44, 46, this is not intended to be limiting. In an alternative configuration (not shown), a separate vacuum system is connected to each respective cavity 44, 46. In yet another alternative configuration, the same vacuum system 62 is connected to both cavities, but the vacuum levels in the cavities 44, 46 are separately controlled to establish respective vacuum levels in the cavities and/or to achieve respective vacuum levels in the cavities at different respective moments in time.

Figure 3C:
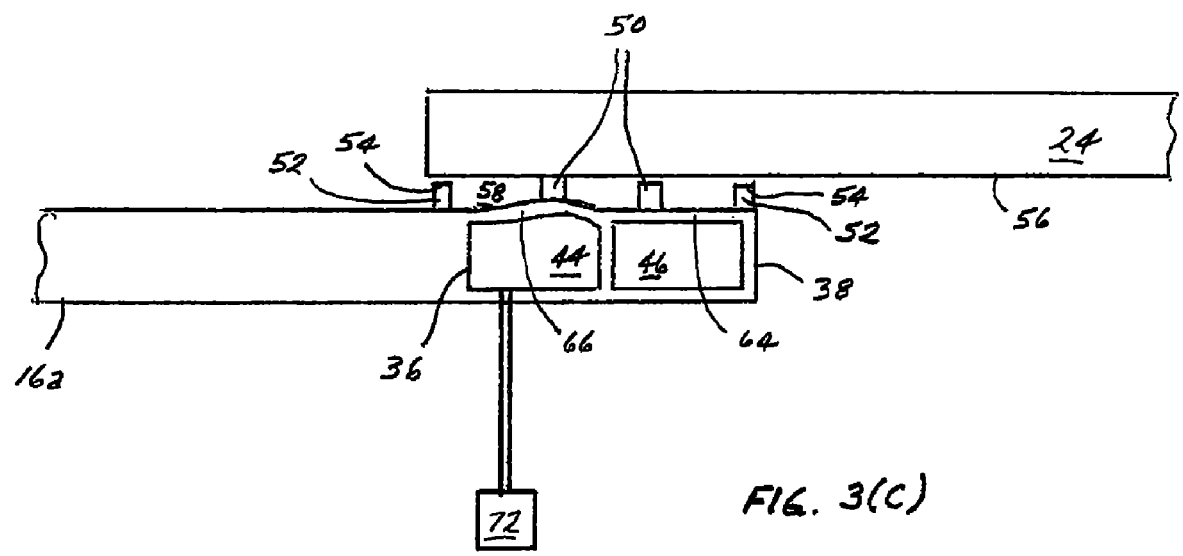
FIG. 3(C) is an elevational schematic view of an embodiment, similar to the configuration of FIG. 3(A), but having a cavity that is pressurized rather than evacuated.

Turning to FIG. 3(C), a further alternative configuration is shown, in which the cavity 44 is connected to a pressure source 72. Whenever the chuck cavity 58 is not being evacuated, and/or at other times as desired or required, the pressure source 72 introduces pneumatic pressure in the cavity 44 to a pressure sufficient to deform at least the corresponding membrane region 66 of the upper membrane portion upward, toward the under-surface 56 of the reticle 24. (This upward deformation is shown highly exaggerated in the figure.) As the membrane region 66 is being deformed in this manner, it carries with it respective pins 50 that are urged against the under-surface 56. The pressure can be sufficient to break contact of the under-surface 56 with the pins 50 extending from the other membrane region 64. In any event, the deformation reduces the net residual force with which the reticle 24 is being held to the vacuum chuck 21a. Meanwhile, a similar deformation desirably is being performed on the other vacuum chuck 21b, which allows the reticle 24 to be removed from the reticle chuck.

Referring further to FIG. 3(C), rather than the cavity 44 being pressurizable as described above, the cavity 46 can be pressurizable using the pressure source 72. Alternatively, both cavities 44, 46 can be pressurizable (dashed line 74). The respective membranes 66, 64 of pressurized cavities 44, 46 generally deflect upward as shown in FIG. 3(C).

In FIGS. 2 and 3(A)-3(C), the cavities 44, 46 are formed in the thickness dimension of a single integral membrane structure 16a. However, forming the cavities 44, 46 within the thickness dimension of a single integral membrane can pose manufacturing challenges (requiring, e.g., machining inward in the x- and y-directions from the edges of the membranes 16a, 16b). To simplify manufacture, it is possible to configure the membrane 16a as two membranes that are laminated together (see line 70 in FIG. 3(A)) after machining the cavities 44, 46 and forming the internal walls 42 in the mating x-y surfaces of either or both membranes. If the membranes are made in such a laminated manner, it is not necessary that they be made of the same material or have the same stiffness.

Figure 4:
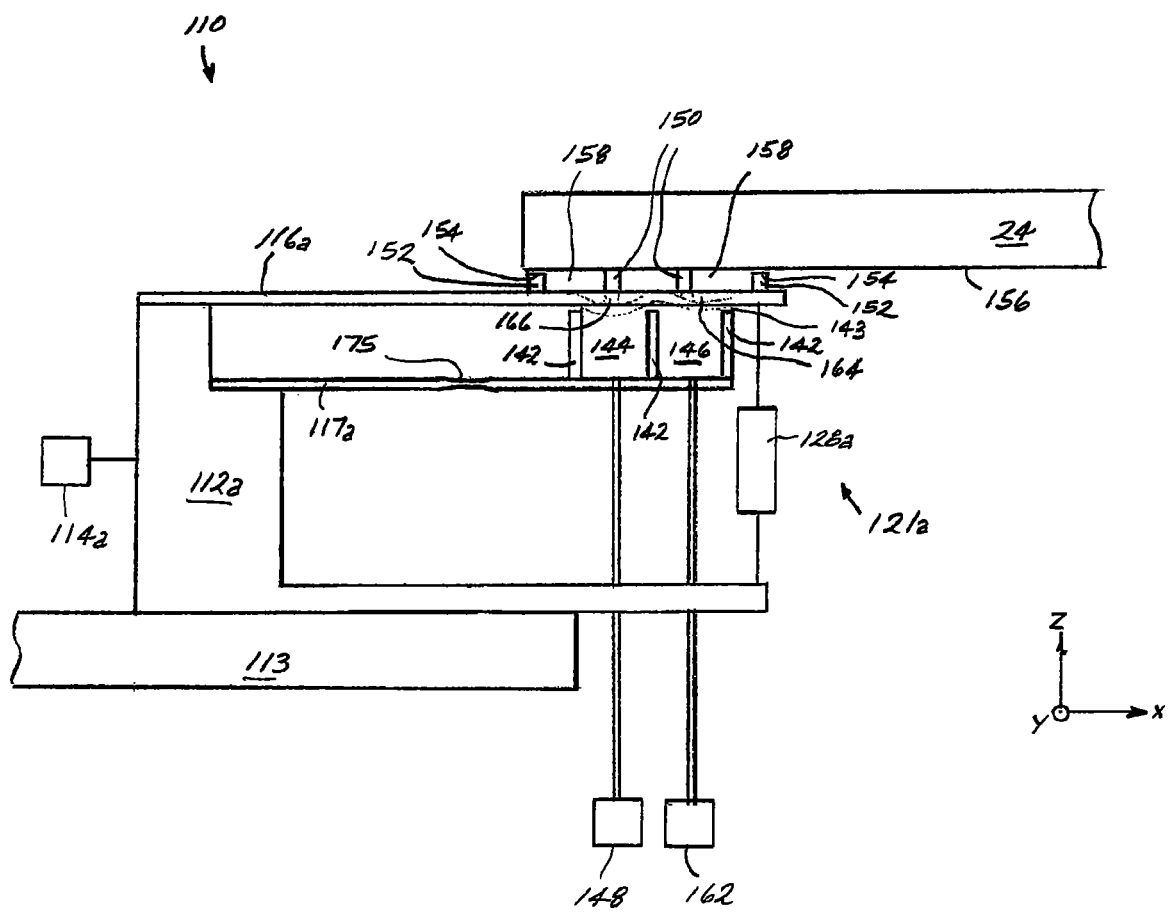
FIG. 4 is an elevational schematic view showing details of a second embodiment of a reticle chuck.

A second representative embodiment of a vacuum chuck 121a is shown in FIG. 4, depicting certain details of the left-hand portion of the reticle stage 110. (It will be understood that a right-hand portion 121b of the vacuum chuck is not shown but nevertheless exists; see FIG. 1, for example.) The stage 110 comprises a stage body 112a and a stage base 113. The stage body 112a is moved relative to the stage base 113 by an actuator 114a. Mounted to and extending rightward in a cantilever manner from the stage body 112a are upper and lower membranes 116a, 117a. At least one Z-support 128a extends from the stage body 112a to the lower membrane 117a. The right-hand portion, not shown, of the stage 110 includes similar components including a stage body 112b, actuator 114b, upper membrane 116b, lower membrane 117b, and at least one Z-support 128b.

The membranes 116a, 117a can be made of the same or different materials. Whether made of similar or different materials, they can have similar or different thickness and similar or different stiffness.

Extending upward from the upper membrane 116a are pins 150 and walls 152, the latter including lands 154. The pins 150 are slightly higher than the walls 152 so that the reticle 24 rests on the tops of the pins and not on the lands 154, thereby defining a gap (e.g., <5 µm) between the under-surface 156 of the reticle 24 and the lands. The upper surface of the upper membrane 116a, the under-surface 156 of the reticle 24, and the walls 152 collectively define a chuck cavity 158. For holding the reticle 24 by vacuum suction, the chuck cavity 158 is evacuated to a specified vacuum level using a vacuum device (not shown, but see FIG. 2, for example).

Extending upward from the upper surface of the lower membrane 117a are internal walls 142 that, together with the under-surface of the upper membrane 116a, define cavities 144, 146. The portion of the upper membrane 116a above the cavity 144 is the membrane portion 166 from which respective pins 150 extend upward. The portion of the upper membrane 116a above the cavity 146 is the membrane portion 164 from which respective pins 150 extend upward. The membrane portions 164, 166 are compliant so as to exhibit downward deflection whenever the respective cavities 144, 146 are evacuated. The internal walls 142 extend upward by a distance slightly less than the z-distance between the membranes 116a, 117a, thereby leaving a gap 143 (e.g., <5 µm) between the tops of the walls 142 and the under-surface of the upper membrane 116a. The upper membrane 116a has sufficient z-direction stiffness to support the reticle 24.

The chuck cavities 144, 146 are used for decreasing the force with which the reticle 24 is being held to the vacuum chuck 121a, 121b. To such end, in the figure, each cavity 144, 146 is connected to a respective vacuum device 148, 162 by which the cavities 144, 146 are evacuated to respective desired vacuum levels at the appropriate time. The vacuum levels can be similar or different. In an alternative configuration (not shown), a single vacuum device is used to evacuate both cavities 144, 146, which is particularly advantageous if both cavities are used and are evacuated to the same vacuum level. In another alternative embodiment, only one cavity is evacuated, which would require only one vacuum device. Evacuating one or both cavities 144, 146 is performed normally whenever the chuck cavity 158 is not being evacuated and it is desired to reduce the residual force holding the reticle 24 to the vacuum chucks 121a, 121b.

Upon evacuating one or both cavities 144, 146, the resulting pressure differential inside the cavity(ies) versus outside the cavities causes the lower membrane 117a to deflect upward sufficiently for the internal walls 142 to contact the under-surface of the upper membrane. Thus, during such times, both membranes 116a, 117a provide support for the reticle 24, and additional z-direction stiffness is contributed by the lower membrane 117a (to the upper membrane 116a holding the reticle 24) at a time when the additional stiffness is most needed (i.e., for removing the reticle). As a result of the increased stiffness contributed by the lower membrane 117a, downward deflection of the membrane portions 144, 146 is facilitated. Other times when additional stiffness in the z-direction is not required (e.g., as the reticle is being used for making lithographic exposures), the lower membrane 117a does not engage the upper membrane 116a. I.e., the tops of the walls 142 are separated from the under-surface of the upper membrane 116a by the gap 143 and thus do not touch the upper membrane, and the lower membrane does not contribute any stiffness to the upper membrane and does not provide any support for the reticle.

To facilitate upward deflection of the lower membrane 117a, the lower membrane 117 can be provided with a hinge 175 (e.g., a thinner region of the membrane, as shown). It is possible, however, to obtain desired performance of the lower membrane 117a without having to provide or use a hinge.

The Z-support 128a desirably contacts the under-surface of the upper membrane 116a. The actual location at which the Z-support contacts the under-surface of the upper membrane can be as shown (beneath the wall 152) or at any of various other locations beneath the vacuum chuck. A particularly advantageous location is just beneath a pin 150, in which case a pass-through would be needed for the Z-support to extend through the lower membrane 117a.

The embodiment of FIG. 4 differs from the first embodiment (FIG. 2) by comprising two membranes 116a, 117a rather than one membrane 16a. The total thickness of the two membranes 116a, 117a in FIG. 4 can be less than the thickness of the one membrane 16a in FIG. 1, the latter requiring sufficient thickness to accommodate, within its thickness dimension, the cavities 44, 46. As a result, the one membrane 16a of FIG. 1 usually has correspondingly greater stiffness than either of the two membranes 116a, 117a or than both membranes 116a, 117a.

The membranes 116a, 117a can be spaced apart from each other in the z-direction by mounting them to corresponding steps in the stage body 112a, as shown. Alternatively, for example, a shim having appropriate thickness can be mounted between the membranes 116a, 117a at, for example, the location in which the membranes are mounted to the stage body 112a.

In contrast to the first embodiment, reduction of residual reticle-holding force by the second embodiment is performed only with application of vacuum, not pressure, to one or both cavities 144, 146. This is because vacuum is required to obtain the desired upward deflection of the lower membrane 117a toward the upper membrane 116a. Application of pressure to the cavities 144, 146 would urge the lower membrane 117a away from the upper membrane 116a.

It will be understood that the description pertaining to the depicted left-hand portion 121a of this embodiment is also applicable to the opposing right-hand portion 121b (not shown).

The various embodiments help achieve increased throughput of a microlithography system by reducing time required for changing reticles. The embodiments achieve this advantage without degrading imaging or overlay performance of the system. To such end, a pneumatic force and inherent pre-load (generated by vacuum-holding the reticle to the reticle chuck and the reticle and chuck having different respective curvatures) are applied to reduce chucking force between the reticle and reticle chuck.

Figure 5:
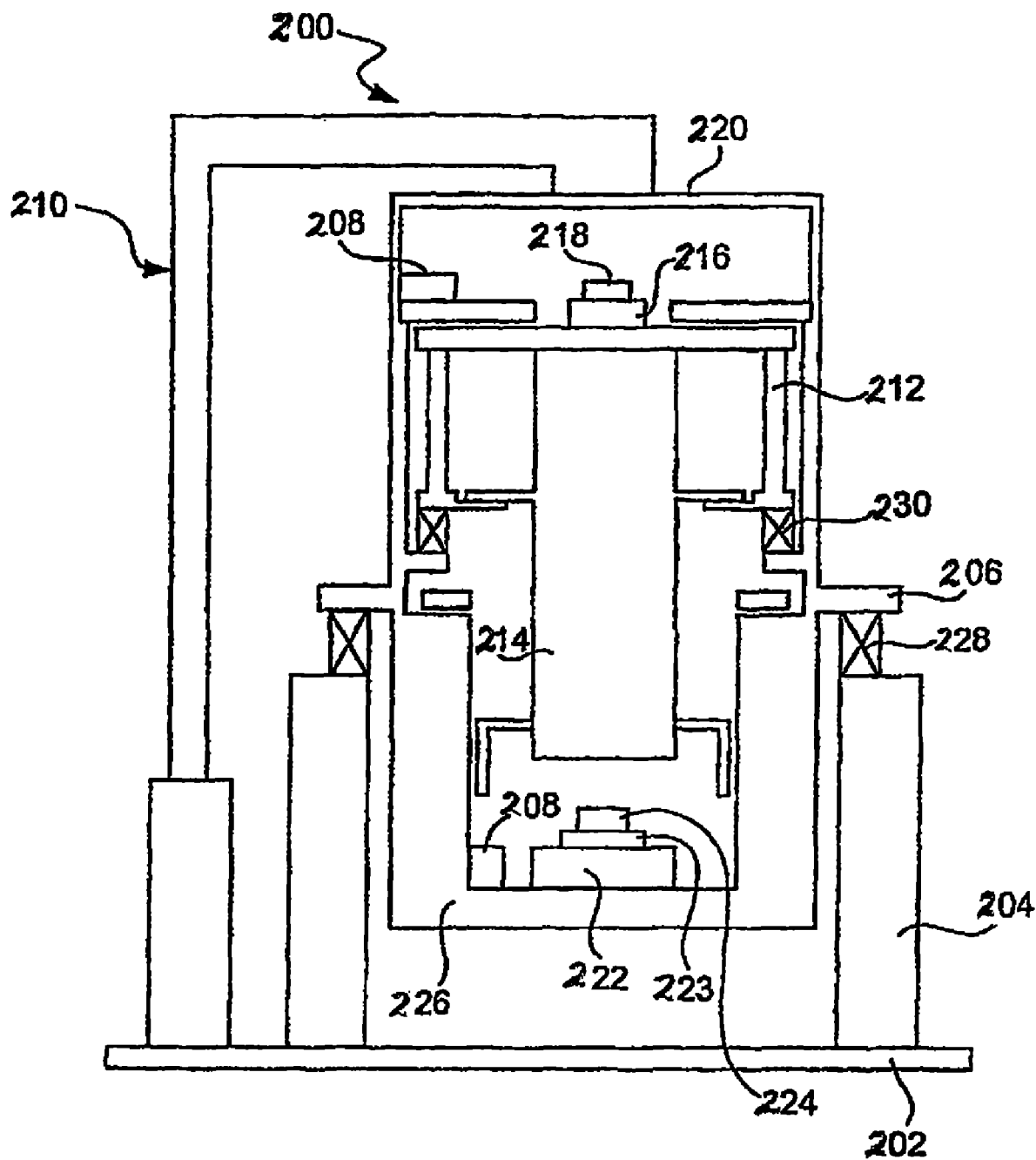
FIG. 5 is a schematic diagram of an embodiment of a lithographic exposure system 200 incorporating a reticle stage as described herein.

Whereas the various embodiments are described in the context of a reticle stage in which the reticle is held by vacuum suction, the principles described herein can also be applied to reducing residual reticle-chucking force in reticle stages in which the reticle is held by a force other than vacuum-suction, such as electrostatic force. Also, whereas the various embodiments are described in the context of reticle stages, the principles described herein can also be applied to a stage for holding something other than a reticle. FIG. 5 shows an embodiment of a lithographic exposure system 200 incorporating a reticle stage as described herein. The system 200 comprises a mounting base 202, a support frame 204, a base frame 206, a measurement system 208, a control system (not shown), an illumination-optical system 210, an optical frame 212, an optical system 214, a reticle stage 216 for holding and moving a reticle 218, an upper enclosure 220 surrounding the reticle stage 216, a substrate stage 222 for holding and moving a lithographic substrate (e.g., a semiconductor wafer), and a lower enclosure 226 surrounding the substrate stage 222. The substrate stage 222 is mounted on a substrate table 223.

The support frame 204 typically supports the base frame 206 above the mounting base 202 via a base vibration-isolation system 228. The base frame 206, in turn, supports (via an optical vibration-isolation system 230) the optical frame 212, the measurement system 208, the reticle stage 216, the upper enclosure 220, the optical system 214, the substrate stage 222, the substrate table 223, and the lower enclosure 226 about the base frame 206. The optical frame 212, in turn, supports the optical system 214 and the reticle stage 216 above the base frame 206 via the optical vibration-isolation system 230. As a result, the optical frame 212, the components supported thereby, and the base frame 206 are effectively attached in series, via the base vibration-isolation system 228, to the mounting base 202. The vibration-isolation systems 228, 230 are configured to damp and isolate vibrations between components of the exposure system 200; each of these systems comprises a vibration-damping device. The measurement system 208 monitors the positions of the stages 216, 222 relative to a reference such as the optical system 214 and outputs position data to a controller. The optical system 214 typically includes a lens assembly that projects and/or focuses light or a light beam from the illumination-optical system that passes through or reflects from the reticle 218. The reticle stage 216 includes one or more actuators (not shown) directed by the controller to position the reticle 218 precisely relative to the optical system 214. Similarly, the substrate stage 222 includes one or more actuators (not shown) to position the substrate 224 with the substrate table 223 precisely relative to the optical system 214. The reticle stage 216 also includes a vacuum-chuck, as described herein, for holding the reticle 218.

As will be appreciated by persons of ordinary skill in the relevant art, there are a number of different types of photolithographic systems. For example, the exposure system 200 can be a scanning-type photolithography system that progressively exposes a pattern from the reticle 218 onto a substrate 224 as the reticle and substrate are moved synchronously. The reticle 218 is moved perpendicularly to the optical axis of the optical system 214 by the reticle stage 216 as the substrate 224 is moved perpendicularly to the optical axis of the optical system by the substrate stage 222. Scanning of the reticle 218 and the substrate 224 occurs while the reticle 218 and the substrate 224 are moving synchronously.

Alternatively, the exposure system 200 can be a step-and-repeat type of photolithography system that exposes the reticle 218 while the reticle and substrate 224 are stationary. The substrate 224 is in a constant position relative to the reticle 218 and the optical system 214 during exposure of an individual field. Subsequently, between consecutive exposure steps, the substrate 224 is consecutively moved by the substrate stage 222 perpendicularly to the optical axis of the optical system 214 so that the next field of the substrate is brought into position relative to the optical system and the reticle 218 for exposure. Following this process, the pattern defined on the reticle 218 is sequentially exposed onto the fields of the substrate 224 so that the next field of the substrate is brought into position relative to the optical system 214 and the reticle.

The use of an exposure system 200 provided herein is not limited to a photolithography system as used for semiconductor-device manufacturing. The exposure system 200, for example, can be used as an LCD photolithography system that exposes the pattern of a liquid-crystal display (LCD) device onto a planar glass plate or as a photolithography system used for manufacturing a thin-film magnetic head. Further alternatively, the system 200 can be used to perform proximity photolithography. In proximity photolithography (used, e.g., for exposing mask patterns) a reticle or mask and the substrate are positioned very closely together axially and exposed without the use of a lens assembly therebetween. In general, the system 200 can be used in any of various other applications, including other semiconductor-processing applications, machine tools, cutting machines, and inspection machines, particular machinery that include reticle stages or analogous appliances.

The illumination source (of the illumination-optical system 210) can be, for example, a source of deep-UV, vacuum-LV, or extreme UV (soft X-ray) radiation. Examples of vacuum-UV sources are KrF excimer laser (248 nm), ArF excimer laser (193 nm), and $F_2$ excimer laser (157 nm). Alternatively, the illumination source can produce a charged particle beam such as an electron beam. Further alternatively, the illumination source can be a source of X-ray radiation. Example electron-beam sources are thermionic-emission types such as lanthanum hexaboride ($LaB_6$) sources and tantalum (Ta) sources, configured as an electron "gun." Electron-beam systems can be based on projection lithography (using a mask or reticle) or direct-writing lithography (in which the pattern is directly formed on the substrate without having to use a mask).

With respect to the optical system 214, whenever a vacuum-UV source such as an excimer laser is used as the source, glassy materials such as quartz and fluorite that transmit deep-UV rays are preferably used. When an $F_2$ excimer laser or X-ray source is used, the optical system 214 should be either catadioptric or reflective (the reticle should also be reflective). When an electron-beam source is used, electron optics should be used such as electron lenses and deflectors. The optical path for electron beams or X-rays should be in a vacuum environment.

Also, with an exposure system that employs vacuum-UV radiation (wavelength of 200 nm or less), use of a catadioptric optical system can be considered. Examples of the catadioptric type of optical system are disclosed in Japan Patent Publication No. Hei 8-171054, corresponding to U.S. Pat. No. 5,668,672, and Japan Patent Publication No. Hei 10-020195, corresponding to U.S. Pat. No. 5,835,275. In these cases, the reflective optical device can be a catadioptric optical system incorporating a beam-splitter and a concave mirror. Japan Patent Publication No. Hei 8-334695 and its counterpart U.S. Pat. No. 5,689,377 and Japan Patent Publication No. Hei 10-003039 and its counterpart U.S. Pat. No. 5,892,117 use a reflective-refractive type of optical system incorporating a concave mirror, etc., but without a beam-splitter.

Further, in photolithography systems, if linear motors (see U.S. Pat. Nos. 5,623,853 and 5,528,118) are used in the substrate stage or reticle stage, the linear motors can be either air-levitation type, employing air bearings, or magnetic-levitation type, using Lorentz force or reactance force. The stage can move along a guide, or it can be guideless.

Alternatively, one of the stages can be driven by a planar motor, which drives the stage by electromagnetic force generated by a magnet unit, having two-dimensionally arranged magnets, and an armature-coil unit having two-dimensionally arranged coils in facing positions. With this type of driving system, either the magnet unit or the armature-coil unit is connected to the stage, and the other unit is mounted on the moving-plane side of the stage.

Movements of a stage, as described above, generate reaction forces that can affect performance of the photolithography system. Reaction forces generated by the substrate-stage motion can be mechanically released to the floor (ground) using a frame member as described in U.S. Pat. No. 5,528,118 and Japan Patent Publication No. Hei 8-166475. Reaction forces generated by the reticle-stage motion can be mechanically released to the floor (ground) using a frame member as described in U.S. Pat. No. 5,874,820 and Japan Patent Publication No. Hei 8-330224.

A photolithography system according to the above-described embodiments can be built by assembling various subsystems, including each element listed in the appended claims, in such a manner that prescribed mechanical accuracy, electrical accuracy, and optical accuracy are achieved and maintained. To obtain the various accuracies, prior to and following assembly every optical system is adjusted to achieve its specified optical accuracy. Similarly, mechanical and electrical systems are adjusted to achieve their respective specified mechanical and electrical accuracies. The process of assembling each subsystem into a photolithography system includes mechanical interfaces, electrical-circuit wiring connections, and air-pressure plumbing connections between each subsystem. There is also a process where each subsystem is assembled prior to assembling a photolithography system from the various subsystems. Once a photolithography system is assembled from the various subsystems, total system calibration and adjustment are performed to make sure that each accuracy specification is achieved and maintained in the complete photolithography system. It is desirable to manufacture an exposure system in a clean-room where the temperature, humidity, and particle load are controlled.

Figure 6:
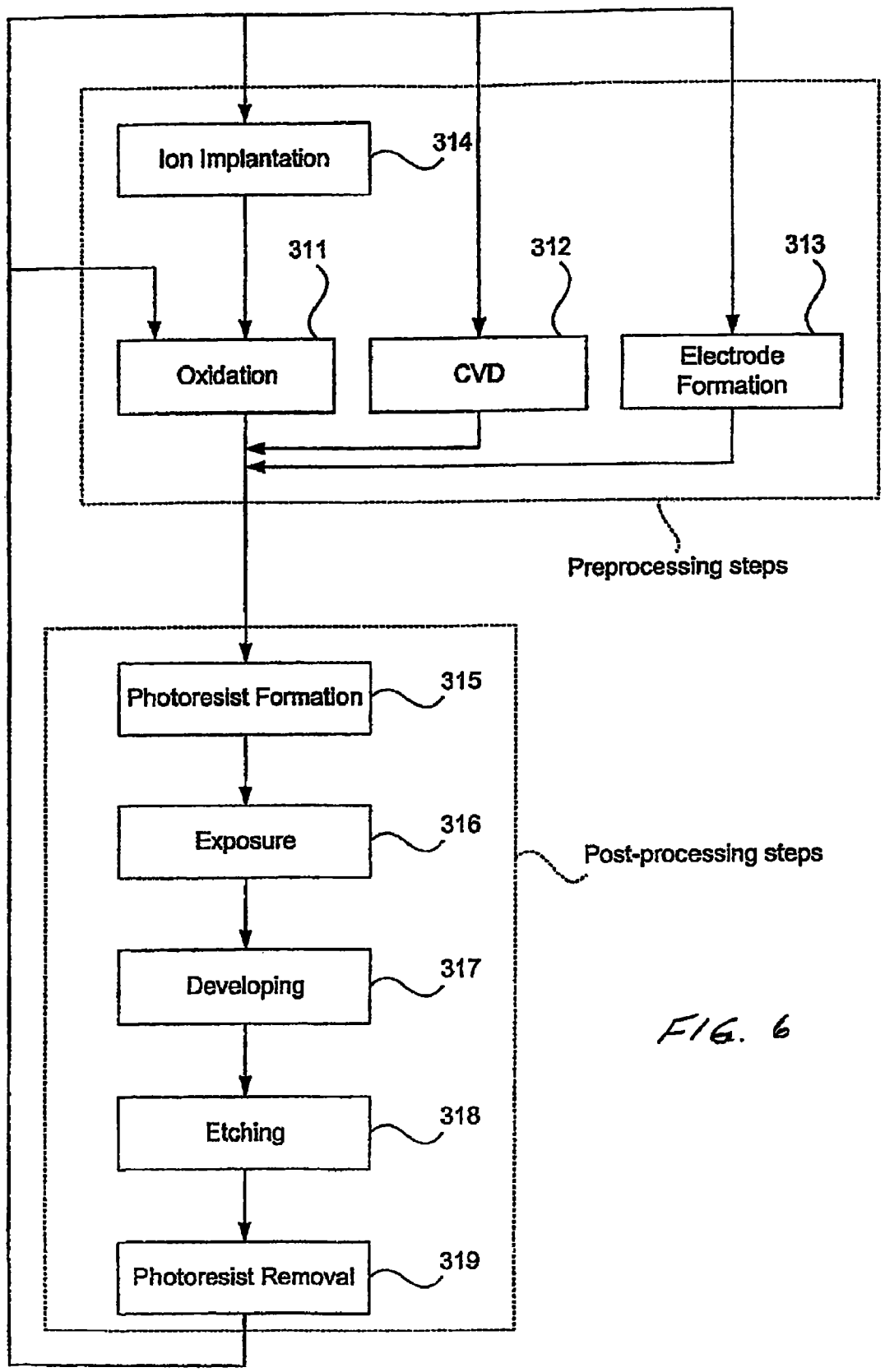
FIG. 6 is a flow-chart of an embodiment of a process for fabricating semiconductor devices and other micro-devices, using a system such as that of FIG. 5.

Semiconductor devices and other micro-devices can be fabricated using a system as described above, using a process shown generally in FIG. 6. In step 301 the function and performance characteristics of the micro-device are established and designed. In step 302 a mask (reticle) defining a pattern is designed according to the previous design step 301. In a parallel step 303 a substrate (e.g., semiconductor wafer) is made from an appropriate material (e.g., silicon). In step 304 the mask pattern designed in step 302 is exposed onto the substrate from step 303 using a photolithography system such as one of the systems described above. In step 305 the semiconductor device is assembled by executing a dicing step, a bonding step, and a packaging step. The completed device is inspected in step 306.

Figure 7:
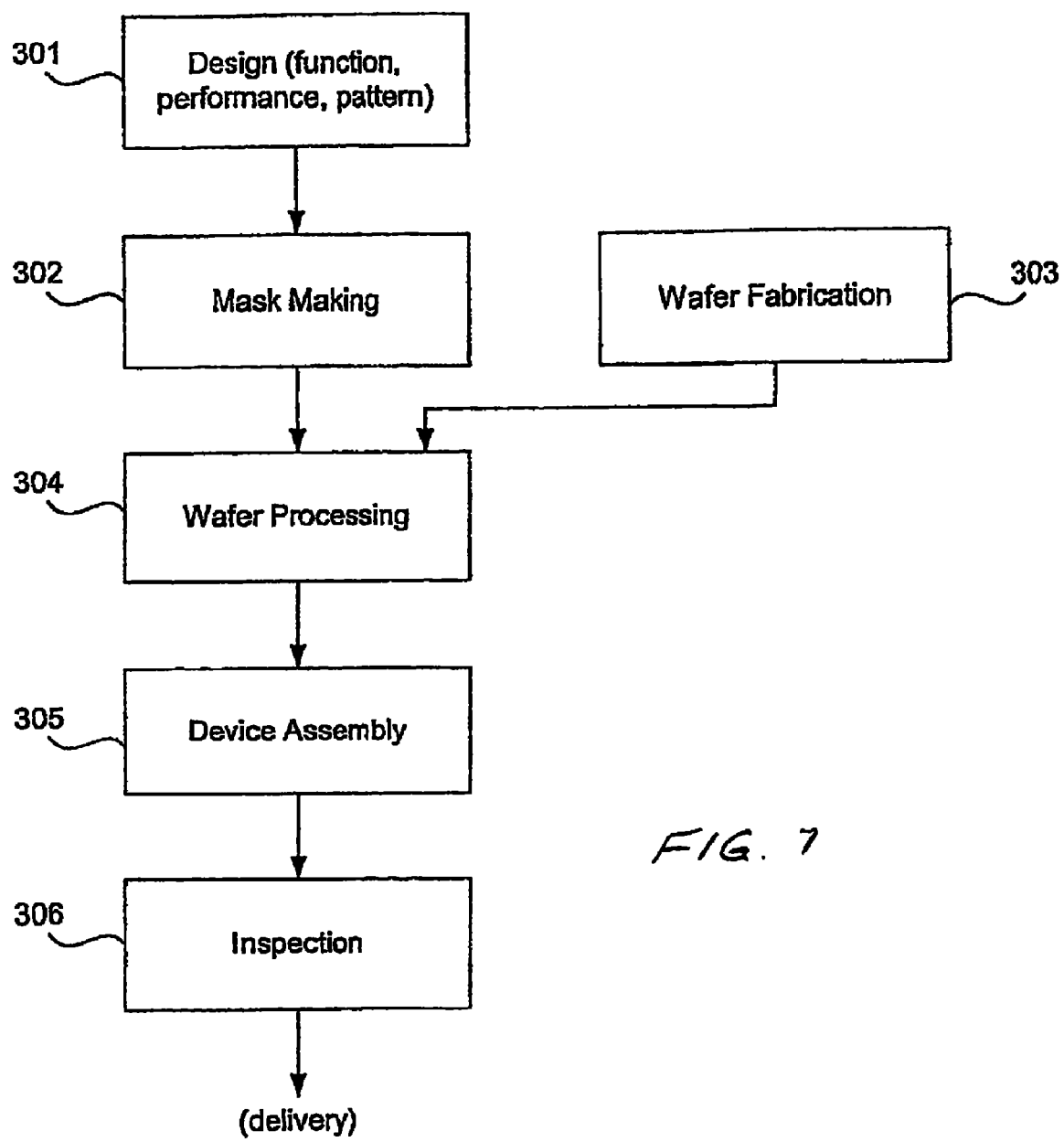
FIG. 7 is a flow-chart of a microlithography step in the process of FIG. 6.

FIG. 7 depicts a flow-chart of an exemplary step 304 used in the case of fabricating semiconductor devices. In step 311 (oxidation) the substrate surface is oxidized. In step 312 (CVD) an insulation layer is formed on the substrate surface. In step 313 (electrode-formation) electrodes are formed on the substrate by vapor deposition or other suitable technique. In step 314 (ion-implantation) ions are implanted in the substrate as required. The steps 311-314 constitute "pre-processing" steps for substrates during substrate processing, and selection is made at each step according to processing requirements.

At each stage of substrate processing, upon completion of the pre-processing steps, the following post-processing steps are performed. In step 315 (photoresist formation) photoresist is applied to the substrate. In step 316 (exposure) the exposure system is used to transfer the circuit pattern of a mask or reticle to the substrate. In step 317 (developing) the exposed substrate is developed. In step 318 (etching) parts other than residual photoresist (i.e., exposed-material surfaces) are removed by etching. In step 319 (photoresist removal) unnecessary photoresist remaining after etching is removed. Multiple circuit patterns are formed by repetition of these pre-processing and post-processing steps.

As far as is permitted by the law, the disclosures in all references cited above are incorporated herein by reference.

Whereas the invention has been described in connection with representative embodiments, it will be understood that it is not limited to those embodiments. On the contrary, the invention is intended to encompass all modifications, alternatives, and equivalents as may be included within the spirit and scope of the invention, as defined by the appended claims.

What is claimed is:

1. A device for holding an object, comprising:
a chuck comprising an object-mounting surface that contacts and holds a corresponding portion of the object, a deformable membrane coupled to at least a portion of the object-mounting surface such that a conformational change in the deformable membrane produces a corresponding change in the object-mounting surface, and a first cavity defined at least in part by the deformable membrane;
a chuck cavity defined between the deformable membrane and the object-mounting surface; and
a pressure-changing device coupled to the first cavity to change pressure in the first cavity, relative to outside the first cavity, sufficiently to produce a conformational change of the deformable membrane and a corresponding change in the object-mounting surface sufficient to reduce a force with which the portion of the object is being held to the object-mounting surface.

2. The device of claim 1, wherein the change in the object-mounting surface includes a reduction in area of contact of the object-mounting surface with the portion of the object.

3. The device of claim 1, wherein:
the chuck is a vacuum chuck; and
the chuck cavity is coupled to a first vacuum device to reduce pressure in the chuck cavity relative to outside the chuck cavity, the reduced pressure holding the portion of the object to the object-mounting surface by vacuum-suction.

4. The device of claim 3, wherein:
the pressure-changing device comprises a second vacuum device; and
the second vacuum device reduces pressure in the first cavity to deform the membrane away from the object and thereby reduce the force with which the portion of the object is being held to the object-mounting surface.

5. The device of claim 4, wherein the second vacuum device operates to reduce pressure in the first cavity at a time when the first vacuum device is off.

6. The device of claim 1, wherein:
the pressure-changing device comprises a pressurizing device; and
the pressurizing device increases pressure in the first cavity, relative to outside the first cavity, to deform the membrane toward the object and thereby reduce the force by which the portion of the object is being held to the object-mounting surface.

7. The device of claim 1, further comprising:
a base; and
a second membrane connecting the chuck to the base.

8. The device of claim 7, wherein the second membrane supports the chuck in a cantilever manner relative to the base.

9. The device of claim 8, wherein the first cavity is defined in at least a portion of the second membrane.

10. The device of claim 8, wherein:
the second membrane comprises an upper membrane portion and a lower membrane portion separated from each other by a space;
the first cavity is defined in the space between the upper and lower membrane portions; and
the deformable membrane is a respective portion of the upper membrane portion.

11. The device of claim 10, further comprising at least two walls extending from the lower membrane portion toward the upper membrane portion to define, in cooperation with the deformable membrane and a corresponding region of the lower membrane portion situated between the walls, the first cavity.

12. The device of claim 11, wherein:
the pressure-changing device comprises a vacuum device;
the vacuum device reduces pressure in the first cavity relative to outside the first cavity; and
the lower membrane portion is movable toward the upper membrane portion in response to the reduced pressure in the first cavity such that the walls contact the upper membrane portion to form a substantially closed first cavity in which the reduced pressure urges the deformable membrane away from the object to produce a corresponding deformation of the object-mounting surface, the deformation reducing the force with which the portion of the object is being held to the object-mounting surface.

13. The device of claim 1, wherein the first cavity is located relative to the chuck such that a change in pressure in the first cavity causes a corresponding conformational change of the deformable membrane.

14. A device for holding an object, comprising:
a chuck comprising an object-mounting surface that contacts and holds a corresponding portion of the object, a deformable membrane coupled to at least a portion of the object-mounting surface such that a conformational change in the deformable membrane produces a corresponding change in the object-mounting surface, and a first cavity defined at least in part by the deformable membrane; and
a pressure-changing device coupled to the first cavity to change pressure in the first cavity, relative to outside the first cavity, sufficiently to produce a conformational change of the deformable membrane and a corresponding change in the object-mounting surface sufficient to reduce a force with which the portion of the object is being held to the object-mounting surface,
wherein the pressure-changing device comprises a vacuum device; and
the vacuum device reduces pressure in the first cavity, relative to outside the first cavity, to deform the membrane away from the object and thereby reduce the force with which the portion of the object is being held to the object-mounting surface.

15. A device for holding an object, comprising:
a chuck comprising an object-mounting surface that contacts and holds a corresponding portion of the object, a deformable membrane coupled to at least a portion of the object-mounting surface such that a conformational change in the deformable membrane produces a corresponding change in the object-mounting surface, and a first cavity defined at least in part by the deformable membrane; and
a pressure-changing device coupled to the first cavity to change pressure in the first cavity, relative to outside the first cavity, sufficiently to produce a conformational change of the deformable membrane and a corresponding change in the object-mounting surface sufficient to reduce a force with which the portion of the object is being held to the object-mounting surface,
wherein the chuck is a vacuum chuck;
a chuck cavity is defined between the deformable membrane and the object-mounting surface; and
the chuck cavity is connected to a vacuum device to reduce pressure in the chuck cavity relative to outside the chuck cavity, the reduced pressure holding the portion of the object to the object-mounting surface by vacuum-suction.

16. The device of claim 15, wherein the pressurizing device operates to reduce pressure in the first cavity at a time when the vacuum device is off.

17. A device for holding an object, comprising:
a chuck comprising an object-mounting surface that contacts and holds a corresponding portion of the object, a deformable membrane coupled to at least a portion of the object-mounting surface such that a conformational change in the deformable membrane produces a corresponding change in the object-mounting surface, and a first cavity defined at least in part by the deformable membrane;
a pressure-changing device coupled to the first cavity to change pressure in the first cavity, relative to outside the first cavity, sufficiently to produce a conformational change of the deformable membrane and a corresponding change in the object-mounting surface sufficient to reduce a force with which the portion of the object is being held to the object-mounting surface, the pressure-changing device comprising a pressurizing device that increases pressure in the first cavity, relative to outside the first cavity, to deform the membrane toward the object and thereby reduce the force by which the portion of the object is being held to the object-mounting surface;
a chuck cavity defined between the deformable membrane and the object-mounting surface; and
multiple pins coupling the deformable membrane to the object-mounting surface, the pins extending from the deformable membrane into the chuck cavity and having respective top surfaces collectively defining at least a portion of the object-mounting surface.

18. The device of claim 17, wherein the pins move with deformation of the membrane to produce the corresponding deformation of the object-mounting surface.

19. A reticle stage, comprising:
a base;
a stage body movable in at least one direction relative to the base;
a vacuum chuck coupled to the stage body, the vacuum chuck including a reticle-mounting surface that receives a corresponding region of a reticle;
a cavity defined by walls and a deformable membrane, the deformable membrane being coupled to the reticle-mounting surface by multiple pins extending from the deformable membrane, the pins having respective top surfaces that collectively define the reticle-mounting surface; and
a pressure-changing device connected to the cavity and being operable to change pressure in the cavity, relative to outside the cavity, sufficiently to deform the membrane and thus the reticle-mounting surface in a manner that reduces a force with which the reticle is being held to the reticle-mounting surface.

20. The reticle stage of claim 19, further comprising a support membrane mounting the vacuum chuck relative to the stage body.

21. The reticle stage of claim 19, wherein the pressure-changing device is operable to reduce pressure in the cavity to deform the membrane in a manner resulting in movement of the reticle-mounting surface away from the corresponding region of the reticle.

22. The reticle stage of claim 19, wherein the pressure-changing device is operable to increase pressure in the cavity to deform the membrane in a manner resulting in movement of the reticle-mounting surface toward the corresponding region of the reticle.

23. The reticle stage of claim 19, wherein the pressure-changing device changes pressure in the cavity, relative to outside the cavity, to deform the membrane in a manner resulting in a decreased contact area of the reticle-mounting surface with the corresponding region of the reticle.

24. The reticle stage of claim 19, further comprising a vacuum device connected to the vacuum chuck, wherein the pressure-changing device is operable to deform the membrane during a time when the vacuum device is off.

25. The reticle stage of claim 19, wherein:
the corresponding region of the reticle is substantially planar; and
the pressure-changing device deforms the membrane in a manner that decreases planarity of the reticle-mounting surface.

26. A lithography system, comprising:
an optical system; and
a reticle stage, as recited in claim 19, situated relative to the optical system.

27. A method for holding a substantially planar object, comprising:
placing a corresponding region of the object on an object-mounting surface collectively defined by top surfaces of multiple pins;
coupling the object-mounting surface to a membrane via the pins;
applying a first force to the region of the object, the first force having magnitude and direction to hold the corresponding region of the object to the object-mounting surface;
preparing for removal of the object from the object-mounting surface by applying a second force to the membrane, the second force having magnitude and direction to deform the membrane and thus the object-mounting surface coupled thereto in a manner that reduces the first force; and
removing the object from the object-mounting surface.

28. The method of claim 27, wherein the first force is produced by a first vacuum-suction.

29. The method of claim 28, wherein the second force is produced by a second vacuum-suction that deforms the membrane, and hence at least a portion of the object-mounting surface, away from the object.

30. The method of claim 29, further comprising:
placing the membrane relative to a cavity; and
the second vacuum-suction is applied to the cavity to deform the membrane.

31. The method of claim 27, wherein the second force is produced by application of pneumatic pressure that deforms the membrane, and hence at least a portion of the object-mounting surface, toward the object.

32. The method of claim 31, further comprising placing the membrane relative to a cavity, wherein the pneumatic pressure is applied to the cavity to deform the membrane.

33. The method of claim 27, wherein the second force is produced at a time when the first force is not being applied.

34. The method of claim 27, wherein:
the object-mounting surface is coupled to the membrane using multiple pins extending from the membrane;
the pins have respective top surfaces that collectively define the object-mounting surface; and
deformation of the membrane results in a corresponding movement of respective pins.

35. The method of claim 27, further comprising supporting the object-mounting surface using a supportive membrane of which the deformable membrane is a part.

36. A method for holding a substantially planar object, comprising:
placing a corresponding region of the object on an object-mounting surface;
coupling the object-mounting surface to a membrane;
applying a first force to the region of the object, the first force being produced by a first vacuum suction and having magnitude and direction to hold the corresponding region of the object to the object-mounting surface;
preparing for removal of the object from the object-mounting surface by applying a second force to the membrane, the second force being produced by a second vacuum-suction that deforms the membrane, and hence at least a portion of the object-mounting surface, away from the object, the second vacuum-suction having magnitude and direction to deform the membrane and thus the object-mounting surface coupled thereto in a manner that reduces the first force; and
removing the object from the object-mounting surface.

37. A method for holding a substantially planar object, comprising:
placing a corresponding region of the object on an object-mounting surface;
coupling the object-mounting surface to a membrane;
applying a first force to the region of the object, the first force having magnitude and direction to hold the corresponding region of the object to the object-mounting surface;
preparing for removal of the object from the object-mounting surface by applying a second force to the membrane, the second force having magnitude and direction to deform the membrane and thus the object-mounting surface coupled thereto in a manner that reduces the first force; and
removing the object from the object-mounting surface;
wherein the object-mounting surface is coupled to the membrane using multiple pins extending from the membrane;
the pins have respective top surfaces that collectively define the object-mounting surface; and
deformation of the membrane results in a corresponding movement of respective pins.

\* \* \* \* \*